(12) United States Patent
Matsuo et al.

(10) Patent No.: US 6,791,174 B2
(45) Date of Patent: Sep. 14, 2004

(54) SEMICONDUCTOR DEVICE WITH GEL RESIN VIBRATION LIMITING MEMBER

(75) Inventors: Haruyuki Matsuo, Tokyo (JP); Ryuuichi Ishii, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/195,759

(22) Filed: Jul. 16, 2002

(65) Prior Publication Data

US 2003/0089974 A1 May 15, 2003

(30) Foreign Application Priority Data

Nov. 9, 2001 (JP) ........................................ 2001-344878

(51) Int. Cl.⁷ ............................ H01L 23/02; H01L 23/22
(52) U.S. Cl. ...................... 257/680; 257/682; 257/787; 257/687; 257/774
(58) Field of Search ................................ 257/687, 678, 257/709, 723, 724, 774, 787, 795, 796, 784, 675, 706, 680, 682, 713, 715, 667, 717, 780, 738, 710; 438/120, 126, 127; 264/272.17

(56) References Cited

U.S. PATENT DOCUMENTS 5,399,805 A * 3/1995 Tyler et al. ................ 174/52.4
6,433,420 B1 * 8/2002 Yang et al.

FOREIGN PATENT DOCUMENTS

| JP | 6-244315 | 9/1994 |
| JP | 2000-311970 | 11/2000 |
| WO | WO 02/059969 A1 | 8/2002 |

* cited by examiner

Primary Examiner—Long Pham
Assistant Examiner—DiLinh Nguyen
(74) Attorney, Agent, or Firm—Sughrue Mion, PLLC

(57) ABSTRACT

A semiconductor device, in which the air within a gel resin can be efficiently and well purged, comprising a casing, a semiconductor device electrically connected by bonding wires and a gel resin filled in the casing and serves for insulation covering of the semiconductor device and the bonding wire. The device further comprises a board-shaped vibration damper in contact with the gel resin and is provided with a plurality of perforations each having an air inlet and an air outlet for the purpose of air extraction during the filling of the gel resin. The sectional area of the perforations is tapered and larger at the inlet than at the outlet, thus causing the perforations to have the form of a substantially conical trapezoid as a whole.

4 Claims, 2 Drawing Sheets

SEMICONDUCTOR DEVICE WITH GEL RESIN VIBRATION LIMITING MEMBER

This application is based on Application No. 2001-344878, filed in Japan on Nov. 9, 2001, the contents of which are hereby incorporated by reference.

BACKGROUND OF THE INVENTION

This invention relates to a semiconductor device mounted on movable bodies such as vehicles.

FIG. 3 shows an example of a conventional semiconductor device mounted on moving bodies. In FIG. 3, 1 is a semiconductor device electrically connected via bonding wires 7 within a casing 5, and forms an electric circuit by being connected via the bonding wires 7 to electrodes 6 disposed in the lateral walls of the casing 5. The semiconductor device 1 is soldered by a solder 3a onto an insulation matrix being soldered by a solder 3b onto a bottom 4 of the casing 5. 8 is a gel resin or gelatious resin filled in the casing 5 and serves for insulation covering of the semiconductor device 1 and the bonding wires 7. 10 is a board-shaped vibration limiting member for limiting the vibrations of the gel resin 8 by being attached to the gel resin 8 and is connected to a lid 9 of the semiconductor device that is secured to both of the lateral walls of the casing 5 via rod-shaped supporting members 15. The vibration limiting member 10 is provided with a plurality of perforations 10a extending therethrough for draining the air mingled in the gel resin 8 during the filling of the gel resin 8 into the casing 5.

A semiconductor device thus composed is shaken by vibrations of a movable body onto which the semiconductor device is mounted because it is used by being mounted onto movable bodies. When the casing 5 of the semiconductor device is shaken, the gel resin 8 filled in the casing 5 is shaken as well. The amplitudes of the vibrations of the gel resin 8 are smaller in the portions of the resin positioned close to the walls of the casing 5 including the bottom and the lateral sides than those in the portion of the resin positioned in the central section of the casing 5 away from the walls, with those in the portion at the surface of the gel resin 8 at the top of the casing 5 being maximum. The problem of the break of the bent sections at both sides of the loops of the bonding wires 7 due to a repetitive stress under which the bent sections are put with the vibrations of the gel resin 8 is prevented by the limitation of the vibrations of the gel resin 8 through the vibration limiting member 10 that is connected to the lid 9 of the semiconductor device and is placed on the gel resin 8 to attach to the surface of the resin.

Yet, in semiconductor devices mounted onto moving bodies, such as vehicles, the gel resin 8 filled in the casing 5 tends to swell not only by the vibrations of the vehicle body but also by an effect of the heat generated at the engine room of the vehicle body and in the surrounding atmosphere, and in particular, by the heating of the semiconductor device. In such a situation, the swollen gel resin 8 overflows through a plurality of the perforations 10a formed in the vibration limiting member 10. The plurality of the perforations 10a therefore serve not only for the purging of the air mingled in the gel resin 8 when filling the gel resin 8 into the casing 5 but also for the release of the gel resin 8 that has swollen upon heating.

For the purpose of purging the air mingled in the gel resin 8 when filling the gel resin 8 into the casing 5, it is desirable that the exposed area of the gel resin 8 at its surface is extended by forming as many perforations 10a as possible. While, for the purpose of limiting the vibrations of the gel resin 8, the number and the size of the perforations 10a must be set at the levels that allow the vibration limiting member 10 to have a large area of contact with the gel resin 8. It is therefore difficult to attain an efficient or a perfect extraction of air from the gel resin 8 contained in the casing 5 by simply forming a plurality of perforations in the vibration limiting member 10 as done so far.

Further, in the system in which the vibration limiting member 10 is secured, such problems as the lodging of the bonding wires 7 and the cracking of the gel resin 8 could occur due to a flow of the gel resin 8 positioned close to the bonding wires 7 toward the perforations 10a, if the gel resin 8 in the casing 5 that has swollen due to the heating of the semiconductor device overflows through a plurality of the perforations 10a formed in the vibration limiting member 10.

SUMMARY OF THE INVENTION

The present invention therefore has as its object the provision of a semiconductor device, in which it is possible to drain the air mingled in a gel resin efficiently and perfectly.

With the above object in view, the semiconductor device comprises a casing, a semiconductor device electrically connected by bonding wires and a gel resin filled in the casing and serves for insulation covering of the semiconductor device and the bonding wire. The device further comprises a board-shaped vibration damper in contact with the gel resin and is provided with a plurality of perforations each having an air inlet and an air outlet for the purpose of air extraction during the filling of the gel resin. The sectional area of the perforations is tapered and larger at the inlet than at the outlet, thus causing the perforations to have the form of a substantially conical trapezoid as a whole.

Therefore, the air mingled within a gel resin of the semiconductor device can be efficiently and well purged.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Embodiment 1

Figure 1:
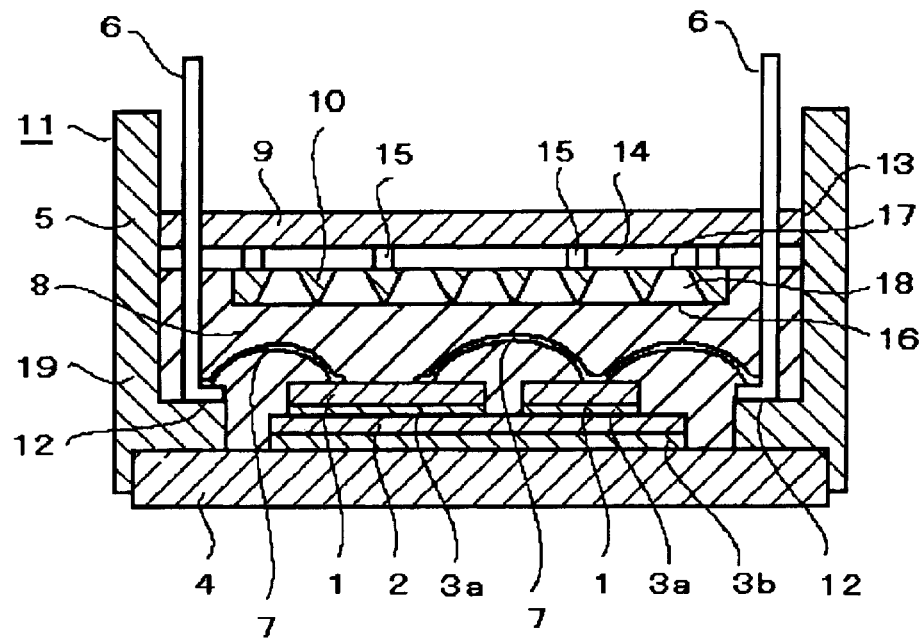
FIG. 1 is a sectional view of the first embodiment of the semiconductor device of the present invention.

FIG. 1 is a sectional view of the semiconductor device representing the first embodiment of the present invention. In FIG. 1, a semiconductor device 11 is provided with a casing 19 that forms the outside structure of the semiconductor device 11. The casing 19 is composed by flange-type lateral walls 5 enclosing the four sides thereof and a bottom 4.

An insulating board 2 is soldered by a solder 3b onto the bottom 4 of the casing 19. A semiconductor device 1 is soldered by a solder 3a onto the insulating board 2. The semiconductor device 1 is electrically connected by a bonding wire 7 to electrodes 6 disposed at bases 12 of the flange-type lateral walls 5 enclosing the four sides.

A gel-type sealing resin or gel resin 8 such as silicone resin is filled in the casing 19 of the semiconductor device 11, and serves for insulation covering of the semiconductor device 1 and the bonding wires 7.

The semiconductor device 11 is provided with a lid 9 secured to inner surfaces 13 of the flange-type lateral walls 5 enclosing the four sides. The lid 9 is secured to the inner surfaces 13 by an adhesive or screws or the like above the gel resin 8 filled in the casing 19 with a space of a predetermined distance lying between the lower surface of the lid 9 and the upper surface of the gel resin 8, thus forming a space 14 between the lid 9 and the gel resin 8.

The semiconductor device 11 is provided with a damper or a vibration limiting member 10 for limiting the vibrations of the gel resin 8 by being attached to the gel resin 8 filled in the casing 19. The vibration limiting member 10 is secured to the casing 19 by being connected to the lid 9 via rod-shaped members 15, and serves for the limitation of the vibrations of the portion of the gel resin 8 positioned in the casing 19 away from the flange-type lateral walls 5 enclosing the four sides of the casing 19 and the bottom 4 in case where the casing 19 of the semiconductor device 11 is vibrated by the outside force. Thus, it is not necessary for the vibration limiting member 10 to be in a size enough to cover the entire area of the surface of the gel resin 8. Because the electrodes 6 are disposed at the bases 12 of the opposing sides of the flange-type lateral walls 5 of the casing 19, the vibration limiting member 10 has the form of a board-shaped rectangular with the sides thereof facing to the electrodes 6 being located slightly away from the electrodes 6. Because an electric circuit is formed within the casing 19 of the semiconductor device 11 by the semiconductor device 1, the bonding wires 7 and the electrodes 6, the vibration limiting member 10 is made from electrically insulating resins such as PVT and acrylic resins.

The vibration limiting member 10 is provided with a plurality of perforations 18 each having an air inlet 16 and an air outlet 17 for purging the air mingled in the gel resin 8 during the filling the gel resin 8 into the casing 19. The sectional area of the air inlet 16 is larger than the sectional area of the air outlet 17 and the section of each of the perforations 18 is reduced gradually toward the end of each of the perforations 18 where the air outlet 17 is formed, thus causing the perforations 18 to have the form of a substantially conical trapezoid as a whole. In each of the perforations 18, an appropriate angle at which the imaginary straight line connecting the air inlet 16 and the air outlet 17 in the section thereof crosses the surface of the gel resin 8 (the angle of tapering) is in the range of approximately 30°–60°. If the angle, or the slope of the tapered surface, is less than 30°, the rising of air bubbles trapped in the air inlets 16 could be hindered, leading to a poor air extraction, while if the angle is over 60°, it is not possible to achieve an extensive air bubble trapping due to an insufficient area of each of the air inlets 16.

Further, if the air inlets 16 are disposed in the manner in which they touch each other at their outer peripheries in the vibration limiting member 10, wherein the board thickness and the sectional area of each of the air outlets 17 remain unchanged, the angle over 60° could induce a poor vibration limiting effect because of an increase in the empty space in the vibration limiting member 10 by the area corresponding to the area in all of the additional perforations 18 formed in the vibration limiting member 10, although the vibration limiting member 10 can accommodate larger numbers of the perforations 18 therein. While, the angle less than 30° could pose a difficulty in achieving an efficient drainage or purging of the air mingled in the gel resin 8 because the vibration limiting member 10 can accommodate lesser numbers of the perforations 18, although the vibration limiting member 10 can perform the damping of the vibrations of the gel resin 8.

During the process of air purging from the gel resin 8, air gets out of the surface of the gel resin 8 evenly because air is drained by operating a vacuum apparatus (not shown) after placing the semiconductor device 11 in the vacuum apparatus. Thus, the area in all of the air inlets 16 that can be formed in the vibration limiting member 10 can be maximized, if the air inlets 16 are disposed in the manner in which they touch each other at their outer peripheries, while minimizing the stagnation of air under the lower surface of the vibration limiting member 10, leading to an efficient purging or draining of the air mingled in the gel resin 8.

Further, when the gel resin 8 is heated and swollen due to the heating of the electric circuit composed by the semiconductor device 1, the bonding wires 7 and the electrodes 6 following the application of electric current or due to the heat transferred to the resin from the engine room of the vehicle onto which the semiconductor device 11 is mounted, the perforations 18 also serve for the release of the swollen gel resin 8 from the air inlets 16 via the air outlets 17 into the space 14 formed between the lid 9 and the gel resin 8. The thickness of the vibration limiting member 10 is therefore at least the thickness having a rigidity enough to endure the force which the vibration limiting member 10 receives from the swollen gel resin 8 during the release of the swollen gel resin 8 into the space 14 from the air inlets 16 via the air outlets 17.

An example of dimensions suitable for the vibration limiting member 10 to be provided in typical semiconductor devices are a thickness of approximately 2–3 mm, a diameter of 5 mm for the air inlets 16, and a diameter of 2 mm for the air outlets 17, and the perforations 18 should be disposed in the manner in which they form a right-angled triangle at a pitch of 5 mm. The preferred angle of tapering of the perforations having the form of a conical trapezoid is approximately 45°, although any angle in the 30–60° range yields a good result.

Although air could mingle in the gel resin 8 during the filling of the gel resin 8 into the casing 19 of the semiconductor device 11, air (air bubbles) must not be included in the gel resin 8 because the gel resin 8 is for electrically insulating the semiconductor device 1 and the bonding wires 7. It is therefore necessary to perform purging of the air mingled in the gel resin 8.

When the vacuum apparatus (not shown) containing the semiconductor device 11 is put into operation for the purpose of extracting the air mingled in the gel resin 8, the air bubbles in the gel resin 8 swell and tend to come up on the surface of the gel resin 8 due to an increase in the buoyancy acting on the swollen air bubbles. In this way, the air bubbles rising through the gel resin 8 are trapped in the air inlets 16 of a plurality of perforations 18. The air bubbles trapped in the air inlets 16 rise further along the tapered surfaces of the perforations 18 and reach the air outlets 17. In the course of rising, the air bubbles that had been trapped in the air inlets 16 in small bubbles gradually aggregate into large bubbles with the progress of rising toward the air outlets 17 because the sectional area of each of the air inlets 16 is larger than that of each of the air outlets 17 and the area is reduced gradually toward the end of the perforations where the ait outlet 17 is formed. After reaching the air outlets 17, the large air bubbles leave the gel resin 8 from the surface thereof, thus completing the extraction of the air mingled in the gel resin 8.

Embodiment 2

Figure 2:
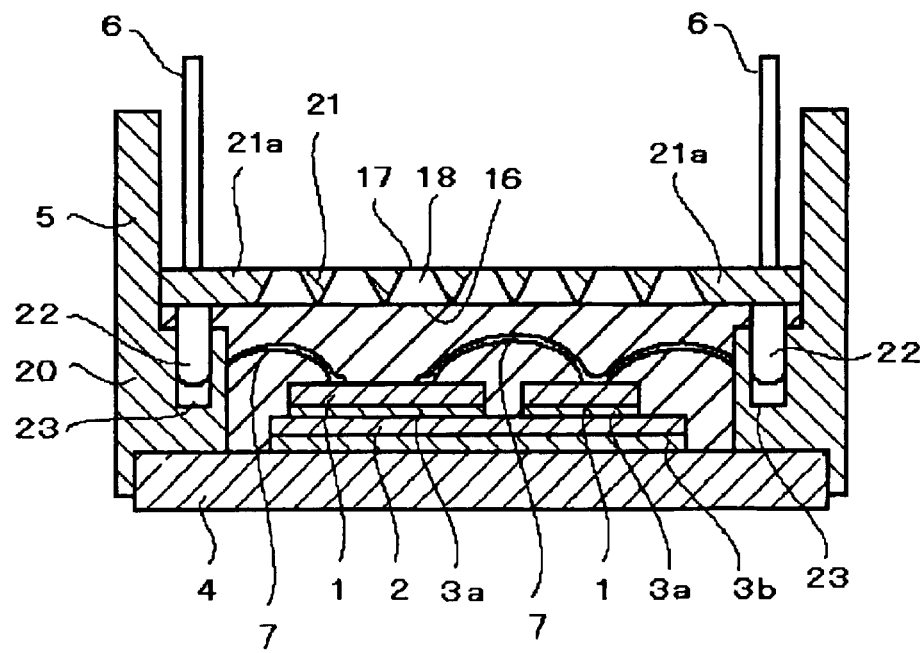
FIG. 2 is a sectional view of the second embodiment of the semiconductor device of the present invention.
Figure 3:
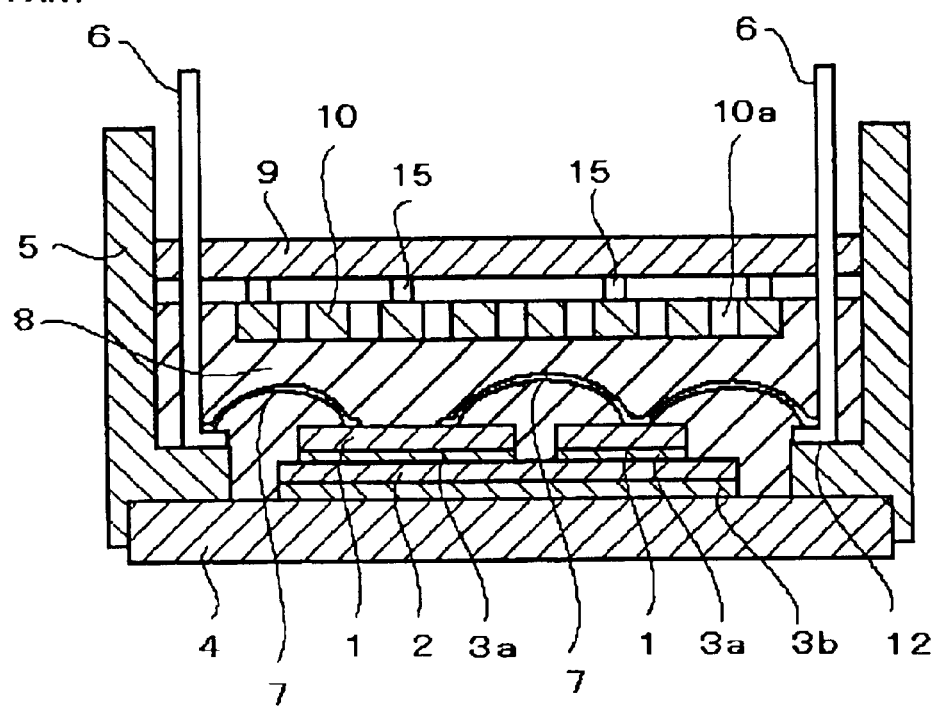
FIG. 3 is a sectional view of a conventional semiconductor device.

FIG. 2 is a sectional view showing a semiconductor device as another embodiment of the present invention, in which the bonding wire and the electrodes for wiring are not illustrated because they are similarly disposed as those shown in FIG. 1. What differs in the semiconductor device shown in this figure from that shown in FIG. 1 is that the system is provided with a floating-type vibration limiting member 21, although the perforations 18 formed therein are same as those formed in the corresponding member shown in FIG. 1 in terms of the dimension, shape and other factors. The vibration limiting member 21 is disposed on the surface of the gel resin 8 by being attached thereto instead of being secured to the lateral walls 5 of a casing 20, and so it is not necessary for the system of this embodiment to be provided with either the lid 9 or the supporting rods 15 that is used for supporting the vibration limiting member in the embodied example shown in FIG. 1. In addition, the space 14 for the release of the gel resin 8 is not formed over the surface of the gel resin 8.

The vibration limiting member 21 is a substantially rectangular board-shaped member, and an extended section 21a extending axially is formed in the middle of each of both ends thereof that are opposing each other. A cylindrical projection 22, or a guide pin, is formed in the extended section 21a perpendicularly to the principal plane of the vibration limiting member 21. A cylindrical concave section 23 with a diameter slightly larger than that of the projection 22 is formed on the step of the base of each of the lateral walls 5 of the casing 20 so that the location of the center and the direction of the axis of the concave section 23 correspond to those of the projection 22. Because the projection 22 of the vibration limiting member 21 is inserted in the concave section 23 and supported slidably in line with the axis thereof, the vibration limiting member 21 is also movable within the casing 20 perpendicularly to the principal plane thereof. The vibration limiting member 21 itself is not explained here again because it is same as that shown in FIG. 1 in other points of composition.

Although the illustrated example is provided with a guide device composed by the projection 22 and the cylindrical concave section 23, the vibration limiting member 21 may be the one having no such guide devices and may be simply placed on the surface of the gel resin 8, or if given any guide device, it may have the device shaped differently.

By the floating-type vibration limiting member 21 like this, the effect of the vibration limiting member 21 in absorbing the swelling of the gel resin 8 due to heat generation during the operation of the semiconductor device 19 and to the heating of the resin by the surrounding atmosphere is exerted and it is possible to achieve an effective air purging in the semiconductor device, in addition to an excellent air purging via the perforations 18 having a tapered surface like that of the embodiment shown in FIG. 1, and so semiconductor devices including such vibration limiting members become mechanically rigid and electrically powerful.

What is claimed is:

1. A semiconductor device comprising:

a casing;

a semiconductor device connected electrically by a bonding wire within said casing;

a gel resin filled in the casing and serves for insulation covering of the semiconductor device and said bonding wire; and a board-shaped vibration limiting member that is disposed in the place where it limits the vibrations of said gel resin by being attached to said gel resin, and is provided with a plurality of perforations each having an air inlet and an air outlet for the purpose of purging air entrained during the filling of the gel resin;

wherein a sectional area of the air inlet of each of the perforations is larger than a sectional area of the air outlet and is reduced gradually toward the end of each of the perforations where the air outlet is formed, thus causing the perforations to have the form of a substantially conical trapezoid as a whole.

2. A semiconductor device as claimed in claim 1, wherein said perforations are disposed in the manner in which the air inlets touch each other.

3. A semiconductor device as claimed in claim 1, wherein said vibration limiting member is secured to said casing.

4. A semiconductor device as claimed in claim 1, wherein said vibration limiting member is disposed movably in said casing at least to the direction meeting the principal plane thereof at a substantially right angle.

* * * * *